United States Patent [19]

Sasame et al.

[11] Patent Number: 4,886,709

[45] Date of Patent: Dec. 12, 1989

[54] MEMBER FOR SEMICONDUCTOR APPARATUS

[75] Inventors: Akira Sasame; Hitoyuki Sakanoue; Hisao Takeuchi; Masaya Miyake; Akira Yamakawa; Yasuhisa Yushio, all of Hyogo, Japan

[73] Assignee: Sumitomo Electric Industries, Ltd., Osaka, Japan

[21] Appl. No.: 214,508

[22] Filed: Jul. 1, 1988

[30] Foreign Application Priority Data

Jul. 3, 1987 [JP] Japan ................. 62-165191

[51] Int. Cl.⁴ .............................................. B22F 3/00
[52] U.S. Cl. .................................... 428/552; 428/620; 428/627; 428/671; 428/675
[58] Field of Search ............... 428/552, 620, 627, 671, 428/675

[56] References Cited

U.S. PATENT DOCUMENTS

| 4,585,706 | 4/1986 | Takeda et al. | 428/620 |
| 4,656,101 | 4/1987 | Yamazaki | 428/620 |
| 4,761,345 | 8/1988 | Sato et al. | 428/552 |

FOREIGN PATENT DOCUMENTS 131026 2/1984 Japan .

Primary Examiner—Stephen J. Lechert, Jr.
Attorney, Agent, or Firm—W. G. Fasse; D. H. Kane, Jr.

[57] ABSTRACT

A member for a semiconductor apparatus for carrying or holding a semiconductor device, obtained by joining an aluminum nitride substrate and a radiating substrate, comprises an insulating member formed by an aluminum nitride sintered body to be provided thereon with the semiconductor device, a radiating member to be joined to the insulating member, which radiating member is mainly formed of a copper-tungsten alloy or a copper-molybdenum alloy, a stress relieving member interposed between the insulating member and the radiating member and a silver solder member for joining the insulating member, the stress relieving member and the radiating member with each other. The stress relieving member is prepared by copper or a copper alloy, implementing a soft metal or a soft alloy having high plastic deformability, in order to relax, by its own plastic deformation, thermal stress caused by difference in thermal expansion coefficient between the insulating member and the radiating member in a cooling step upon soldering.

9 Claims, 5 Drawing Sheets

MEMBER FOR SEMICONDUCTOR APPARATUS

BACKGROUND OF THE INVENTION

1. Field of the Invention

The present invention relates to a member for a semiconductor apparatus, and more particularly, it relates to a member for a semiconductor apparatus such as a circuit substrate, which must be of high thermal conductivity to be mounted with a semiconductor device of high calorific power such as a high-power transistor or a laser diode.

2. Description of the Prior Art

A member for a semiconductor apparatus to be mounted with a semiconductor device is generally formed by an insulating member and a radiating member joined to the insulating member. For example, such a member for a semiconductor apparatus is formed by an insulating substrate to be provided thereon with a semiconductor device and a radiating substrate joined to the back surface of the insulating substrate by soldering through silver solder or the like. In this case, generally required for the insulating substrate are high electric insulability for insulation from the semiconductor device, high mechanical strength and high thermal conductivity for dissipating heat generated from the semiconductor device. The radiating substrate must have high thermal conductivity similarly to the insulating substrate, while its thermal expansion coefficient must be approximate to those of materials forming a semiconductor substrate, the insulating substrate and the like.

In general, alumina ($Al_2O_3$) is selected as a material satisfying the aforementioned properties for forming the insulating substrate employed in such a member for a semiconductor apparatus. However, although alumina is excellent in electric insulability and mechanical strength, its heat dissipation property is inferior due to small thermal conductivity of 17 $Wm^{-1}K^{-1}$. Thus, it is improper to carry a field-effect transistor (FET) of high calorific power, for example, on an alumina substrate. In order to carry a semiconductor device of high calorific power, another type of insulating substrate is prepared by beryllia (BeO) having high thermal conductivity of 260 $Wm^{-1}K^{-1}$, whereas beryllia is toxic and hence it is troublesome to take safety measures in employment of such an insulating substrate.

The radiating substrate is generally prepared by a material satisfying the aforementioned properties, which material is selected from metal materials such as various types of copper alloys, copper-tungsten alloys and copper-molybdenum alloys. For example, Japanese Patent Laying-Open Gazette No. 21032/1984 discloses a substrate of high thermal conductivity for carrying a semiconductor device, the material of which is prepared by mixing 2 to 30 percent by weight of copper into tungsten or molybdenum. This substrate is employed as a radiating substrate which is suitably joined to an alumina substrate having inferior heat dissipation property, and difference in thermal expansion coefficient between the same and alumina is relatively small. Thus, this prior art example is insufficient in heat dissipation property, which is required entirely over a substrate for carrying a semiconductor device.

In recent years, nontoxic aluminum nitride (AlN) has generated great interest as a material for such an insulating substrate for carrying a semiconductor device of high calorific power because of its high thermal conductivity of about 200 $Wm^{-1}K^{-1}$, which value is substantially equal to that of beryllia, as well as its electric insulability and mechanical strength which are equivalent to those of alumina.

However, when an aluminum nitride substrate provided with a metallized layer is soldered by a soldering metal such as gold solder or silver solder, for example, to a generally employed radiating substrate of a copper-tungsten alloy or copper-molybdenum alloy containing 10 to 25 percent by weight of copper, the aluminum nitride substrate may be cracked or the radiating substrate of the copper-tungsten alloy or the copper-molybdenum alloy may be warped.

Such a phenomenon results from thermal stress caused of difference in thermal expansion coefficient between the copper-tungsten alloy or the copper-molybdenum alloy and the aluminum nitride during a cooling step after soldering, which is performed at a temperature of 500° to 950° C. This thermal stress may conceivably be left in the aluminum nitride substrate as tensile residual stress, to crack the aluminum nitride substrate and/or warp the radiating substrate of the copper-tungsten alloy or the copper-molybdenum alloy.

When an aluminum nitride substrate is joined to a radiating substrate of a copper-tungsten alloy or a copper-molybdenum alloy by cold soldering or soldering, the aluminum nitride substrate or an interface between the same and a metallized layer is cracked by a thermo-cycle test ($-55°$ C. to $+150°$ C., 1000 cycles) or a thermal shock test. The result indicates a significant problem in practice, even if neither a warp nor a crack is recognized upon joining.

In a sample of an aluminum nitride substrate joined to a radiating substrate of a copper-tungsten alloy or a copper-molybdenum alloy by silver soldering, thermal fatigue or thermal stress was caused in a thermo-cycle test or a thermal shock test due to difference in thermal expansion coefficient between the radiating substrate of the copper-tungsten alloy or the copper-molybdenum alloy and the aluminum nitride substrate, similarly to the above. Such a problem of thermal stress or thermal fatigue is aggravated with increase in junction area.

Thermal expansion coefficients of the copper-tungsten alloy or the copper-molybdenum alloy having the aforementioned composition and aluminum nitride are 6.5 to $10 \times 10^{-6}$/K and 4 to $5 \times 10^{-6}$/K respectively, within a range of the room temperature to about 950° C. Further, these materials, having high Young's modulus of 27,000 to 35,000 $Kg/mm^2$ and 35,000 to 37,000 $Kg/mm^2$ respectively, are hardly plastically deformed. Thus, when the copper-tungsten alloy or the copper-molybdenum alloy of the aforementioned composition and aluminum nitride are joined with each other by soldering, large thermal stress is conceivably caused in a cooling step.

SUMMARY OF THE INVENTION

An object of the present invention is to provide a member for a semiconductor apparatus by employing an insulating member of aluminum nitride, being excellent in thermal dissipation property, for mounting a semiconductor device of high calorific power, so that a radiating member mainly formed of a copper-tungsten alloy or a copper-molybdenum alloy having high heat radiation property can be joined to the insulating member while causing no crack nor warp.

The invention aim to solve the aforementioned problem. It has been found that it is effective to interpose a specific thermal stress relieving member between an insulating member of aluminum nitride and a radiating member mainly formed of a copper-tungsten alloy or a copper-molybdenum alloy, to prevent cracking or warping caused by thermal stress in a cooling step upon soldering.

A member for a semiconductor apparatus in accordance with the present invention, being adapted to carry or hold a semiconductor device, comprises an insulating member of aluminum nitride having a major surface to face the semiconductor device, a radiating member to be joined to the insulating member and mainly formed of a copper-tungsten alloy or a copper-molybdenum alloy, a stress relieving member, and a soldering member for joining the insulating member, the stress relieving member and the radiating member with each other. The stress relieving member, to be interposed between the insulating member and the radiating member, is prepared by a soft metal or a soft alloy having high plastic deformability in order to relax, through its own plastic deformation, thermal stress caused by difference in thermal expansion coefficient between the insulating member and the radiating member in a cooling step upon soldering. Preferably the stress relieving member is prepared by copper, a copper alloy, nickel or a nickel alloy.

The stress relieving member, of either a soft metal or a soft alloy thus interposed between the insulating member of aluminum nitride and the radiating member, is further softened around the soldering temperature, to be extremely plastically, deformable. Thus, most of the thermal stress caused by the difference in the thermal expansion coefficients between the insulating member of aluminum nitride and the radiating member, is absorbed by plastic deformation of the stress relieving member, to solve the problem of residual stress in the insulating member. Consequently, the insulating member is prevented from cracking and the radiating member is prevented from warping.

The stress relieving member is preferably in a range of 0.01 to 1 mm in thickness. If the thickness is not more than 0.01 mm, the stress relieving member cannot be sufficiently plastically deformed to absorb thermal stress. If the thickness exceeds 1 mm, on the other hand, thermal stress caused by thermal expansion of the stress relieving member itself in soldering cannot be neglected. Namely, although thermal stress caused by difference in thermal expansion coefficient between the radiating member and the insulating member can be absorbed by plastic deformation of the stress relieving member, the stress relieving member itself causes significant thermal stress to exert bad influence of thermal deformation on the radiating member or the insulating member.

The insulating member of aluminum nitride is preferably employed as a substrate having a major surface to be provided thereon with a semiconductor device. Alternatively, the insulating member may be applied to a covering member provided above a semiconductor device to protect the same, which covering member forms a cap for airtightly sealing a semiconductor device provided on an insulating substrate, for example. When the insulating member is employed as a substrate for carrying a semiconductor device or a covering member for protecting a semiconductor device, the inventive member for a semiconductor apparatus is adapted to conduct heat generated from the semiconductor device to the insulating member and a radiating member, thereby to dissipate the same to the exterior. The insulating member of aluminum nitride preferably includes a sintered body.

The insulating member of aluminum nitride is preferably provided on its junction surface with a metallized layer, which contains at least tungsten or molybdenum, at least one aluminum compound within aluminum nitride, aluminum oxide and aluminum oxynitride, andcalcium oxide or yttrium oxide, to attain preferable junction strength and thermal conductivity.

Further, a plating layer is provided in a junction surface of the metallized layer with a soldering member to uniformly perform stabilized soldering. Namely, wettability between the soldering member and the metallized layer can be improved by provision of the plating layer. Another plating layer provided in a junction surface of the radiating member with the soldering member functions similarly to the above. Such plating layers are preferably formed by nickel plating. Such nickel plating is preferably performed particularly when processing, such as gold plating, is performed in a later step, in order to improve adhesion and precipitation properties of gold plating for forming a uniform gold plating layer.

Further, the copper-tungsten alloy or the copper-molybdenum alloy employed for the inventive member preferably contains 5 to 25 percent by weight of copper. If the content of copper is less than 5 percent by weight, thermal conductivity, being an essential function of the copper-tungsten alloy or the copper-molybdenum alloy forming the radiating member, may be lost. However, a mismatch in thermal expansion coefficients between the copper-tungsten alloy or the copper-molybdenum alloy and the aluminum nitride is still reduced. If the content of copper exceeds 25 percent by weight, the thermal expansion coefficient of the copper-tungsten alloy or the copper-molybdenum alloy is further increased to differ from that of aluminum nitride, leading to an increase in thermal stress caused in the junction surface. However, the thermal conductivity of the copper-tungsten alloy or the copper-molybdenum alloy is increased.

According to the inventive member for a semiconductor apparatus, a stress relieving member is interposed between the insulating member and the radiating member, thereby to prevent cracking of the insulating member and warping of the radiating member upon joining of the insulating member of aluminum nitride and the radiating member mainly formed of the copper-tungsten alloy or the copper-molybdenum alloy. Thus, a reliable member for a semiconductor apparatus can be easily obtained to be applied to a substrate for carrying a semiconductor apparatus, a covering member for sealing a semiconductor device or the like.

These and other objects, features, aspects and advantages of the present invention will become more apparent from the following detailed description of the present invention when taken in conjunction with the accompanying drawings.

DESCRIPTION OF THE PREFERRED EMBODIMENTS

As hereinabove described, the present invention is adapted to improve the technique of forming a member for a semiconductor apparatus by employing an insulating member of aluminum nitride. Aluminum nitride employed in the form of a sintered body in the present invention is obtained by the following method, for example:

The insulating member formed by an aluminum nitride sintered body employed in the present invention, preferably being mainly composed of aluminum nitride, contains 0.01 to 1.0 percent by weight of an element belonging to the group IIIa of the periodic table and 0.001 to 0.5 percent by weight of oxygen, and its thermal conductivity is at least 180 $Wm^{-1}K^{-1}$. First, at least one compound containing a rare earth element is mixed with powder of aluminum nitride so that its content is 0.01 to 1.0 percent by weight in rare earth element conversion. A forming additive is prepared by paraphine, PVD or PEG. A substance, such as phenol resin, being decomposed to leave carbon, carbon powder, graphite powder or the like may be added to control residual carbon in the sintered body. The rare earth compound is prepared by stearic acid, palmitic acid, alkoxide nitrate, carbonate, hydroxide or the like. Preferably employed is a high molecule compound such as stearic acid. Such a compound is conceivably adapted to reduce the content of the rare earth element to enable good mixing with aluminum nitride powder. In particular, stearic acid is most preferable in view of mixability with aluminum nitride powder, the amount of residual carbon etc. in addition to its function as a forming additive. The aluminum nitride powder must be formed by fine uniform particles. Preferably its average particle size is not more than 1 $\mu m$, and the oxygen content is not more than 2.0 percent by weight. Such aluminum nitride powder is obtained by a reduction nitriding method (method by reduction nitriding of aluminum oxide), since it is difficult to obtain the same by a direct nitriding method (method by nitriding of metal aluminum). In order to obtain the powder by the direct nitriding method, sufficient consideration must be made on reaction control, classification of the particle size and the like.

Then the mixed powder is shaped into a prescribed configuration and sintered in a non-oxidizing atmosphere containing nitrogen. In order to attain high thermal conductivity, it is preferable to sinter the substance at a temperature of 1000° to 2100° C. for at least five hours, so that its average particle size is at least 5 $\mu m$. After such sintering, it is preferable to quickly carry out a cooling step. If the substance is slowly cooled, a sintering additive is precipitated and the sintered face is extremely deteriorated. Therefore, the sintered body is preferably cooled to a temperature of 1500° C. at a rate of at least 200° C./h.

The steps of forming a metallized layer on the surface of a substrate formed by the aluminum nitride sintered body obtained in the aforementioned manner are performed as follows.

First, a substrate of the aluminum nitride sintered body is prepared by the aforementioned method. A material for the metallized layer is prepared by kneading powder of a calcium compound, that of an aluminum compound and metal powder of tungsten or molybdenum with the addition of an organic binder to provide form a metal paste. The contents of the respective components may be within the ranges of 40 to 98 percent by weight of the metal powder, 1 to 25 percent by weight of the aluminum compound and 1 to 35 percent by weight of calcium oxide. In order to perform a later sintering step at a low temperature, copper or nickel may be added as a catalyst for reducing the sintering temperature. The metal paste thus provided is applied to the surface of the substrate formed by the aluminum nitride sintered body. The substrate formed by the aluminum nitride sintered body is fired in an inert atmosphere of nitrogen or the like at a temperature of 1500° to 1800° C., to be provided with a metallized layer on its surface. A metallized layer prepared by metal powder of tungsten and containing 1 to 10 percent by weight of aluminum oxide, employed as the aluminum compound, and 1 to 20 percent by weight of calcium oxide, or that prepared by metal powder of molybdenum and containing 1 to 10 percent by weight of aluminum oxide, employed as the aluminum compound, and 1 to 35 percent by weight of calcium oxide is preferable in view of adhesion between the substrate formed by the aluminum nitride sintered body and the metallized layer and thermal conductivity.

The steps of forming a metallized layer on the surface of a substrate formed by the aluminum nitride sintered body may be performed as follows, by sintering an aluminum nitride formed body coated with the metal paste at one time.

First, a substrate of the aluminum nitride formed body is prepared by shaping the aforementioned mixed powder into a prescribed configuration such as a green sheet. A material for the metallized layer is prepared by kneading powder of tungsten and at least one additive selected from a group of aluminum oxide, aluminum nitride, calcium oxide, yttrium oxide and stearic acid yttrium and the like, to provide metal paste, similarly to the above. The metal paste thus provided is applied to the surface of the substrate formed by the aluminum nitride formed body, by printing or coating. The substrate formed by the aluminum nitride body is sintered with the metal paste similarly to the above conditions, to be provided with a metallized layer on the surface of a substrate formed by the aluminum nitride sintered body. Thus, the aluminum nitride sintered body with a metallized layer having a high thermal conductivity can be obtained.

Figure 1A:
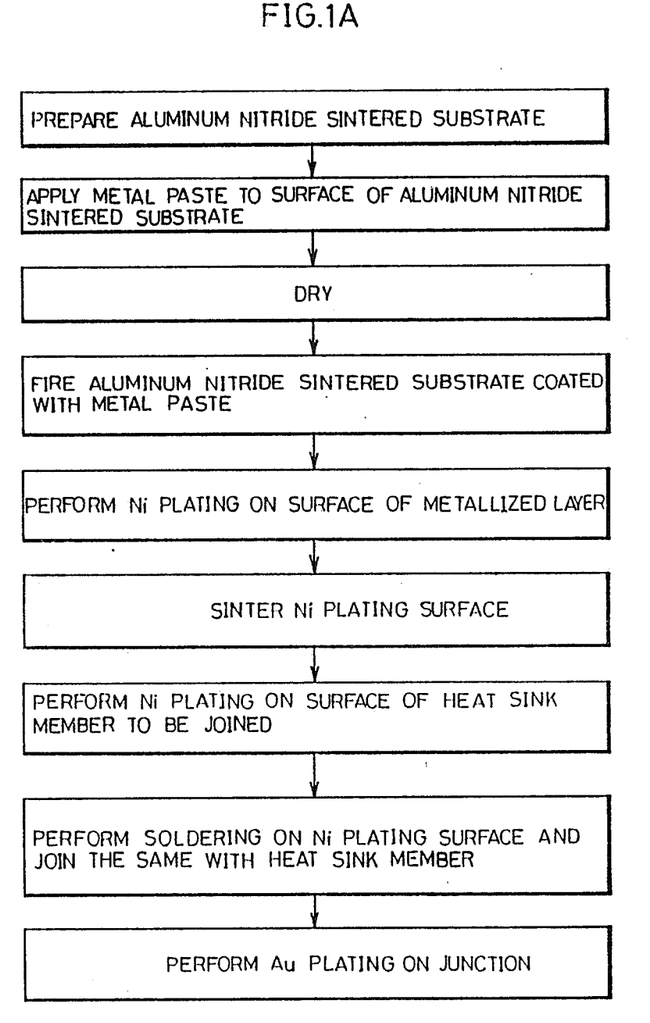
FIGS. 1A. and 1B are process drawings schematically showing two exemplary methods of manufacturing a member for a semiconductor apparatus in accordance with the present invention.
Figure 1B:
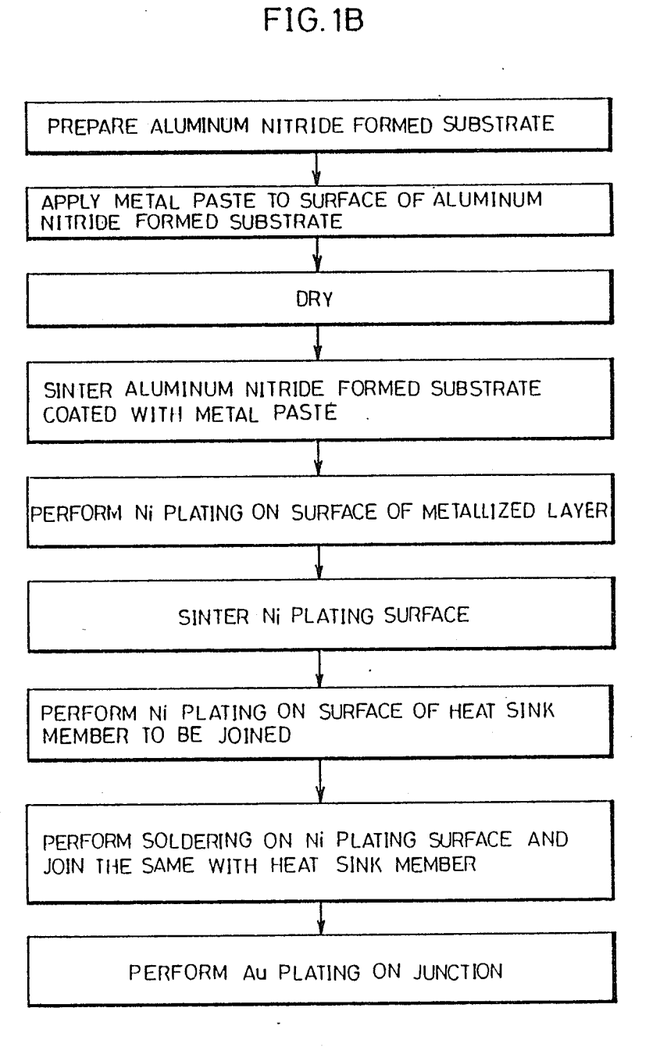

Description is now made on a typical method of forming the member for a semiconductor apparatus in accordance with the present invention. FIGS. 1A and 1B are process drawings showing two methods of manufacturing the member for a semiconductor apparatus in accordance with the present invention. Referring to FIG. 1A, an aluminum nitride sintered substrate is first prepared. Then, the metal paste obtained through the aforementioned method is applied to the surface of the aluminum nitride sintered substrate. Thereafter the metal paste thus applied is dried. Then the aluminum nitride sintered substrate is fired in an inert gas atmosphere which is heated to a prescribed temperature.

The above steps may be performed as follows. Referring to FIG. 1B, an aluminum nitride formed substrate is first prepared. Then, the metal paste obtained through the aforementioned method is applied to the surface of the aluminum nitride formed substrate. Thereafter the metal paste thus applied is dried. Then the aluminum nitride formed substrate is sintered with the metal paste in an inert gas atmosphere which is heated to a prescribed temperature. Thus, an aluminum nitride sintered substrate with a metallized layer is formed.

After a metallized layer is formed on the aluminum nitride sintered substrate, nickel plating is performed on the surface of the metallized layer. Heat treatment is performed at a temperature of about 800° C. to sinter the nickel plating, thereby to improve strength and airtightness of the same. On the other hand, nickel plating is also performed on the surface of a heat sink member, serving as a radiating member, which is joined to the aluminum nitride sintered substrate, similarly to the above. Then soldering is performed on the nickel plating surface in order to join the aluminum nitride sintered substrate to the heat sink member. Further, gold plating is performed on such junction. Thus, the member for a semiconductor apparatus in accordance with the present invention can be manufactured.

Description is now made on an embodiment of a member for a semiconductor apparatus in accordance with an aspect of the present invention, which is manufactured along the aforementioned steps, such as a member comprising an aluminum nitride substrate joined to a lead frame on its surface and to a heat sink member on its back surface, with reference to the drawings.

Figure 2A:
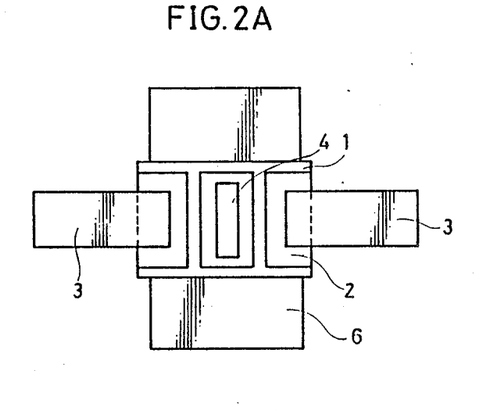
FIGS. 2A, 2B and 2C are a plan view and sectional views showing an example of junction structure in a member for a semiconductor apparatus in accordance with the present invention, such as junction structure between a lead frame, an aluminum nitride substrate and a radiating substrate.
Figure 2B:
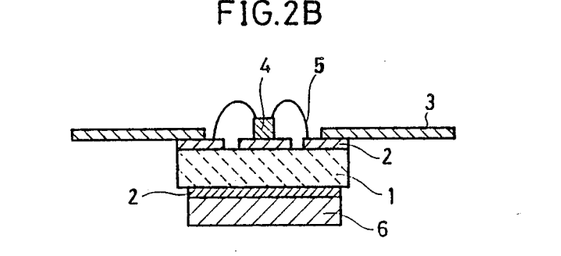
Figure 2C:
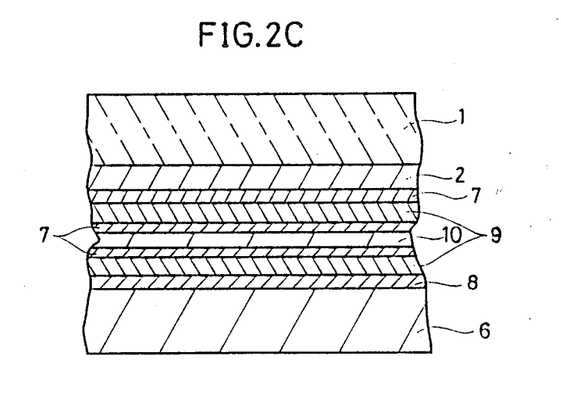

FIG. 2A is a plan view showing an embodiment which is applied to a substrate for carrying a semiconductor device, FIG. 2B is a sectional view of the substrate and FIG. 2C is a sectional view showing a junction between a heat sink member 6 and an aluminum nitride substrate 1 in detail. Referring to these figures, the aluminum nitride substrate 1, implementing the inventive member for a semiconductor apparatus, is partially formed on its surface with a metallized layer 2 in accordance with the aforementioned steps, and a lead frame 3 is joined to the metallized layer 2 through soldering by a soldering metal or the like. Another metallized layer 2 is formed on a part of the back surface of the aluminum nitride substrate 1 in accordance with the aforementioned steps, while the heat sink member 6 is joined to the metallized layer 2 through soldering by a soldering metal or the like. A semiconductor device 4 such as an FET of high calorific power is carried on a prescribed position of the aluminum nitride substrate 1, to be connected with the metallized layer 2 or the lead frame 3 by a bonding wire 5. As shown in FIG. 2C, a thin plating layer 7 is formed on the metallized layer 2 in the junction between the aluminum nitride substrate 1 and the heat sink member. 6, while a plating layer 8 is formed at need on the surface of the heat sink member 6, in order to stabilize wettability of a soldering metal 9. In this case, a stress relieving member 10 of a soft metal such as copper, which is formed with nickel plating layers 7 on its surface, is interposed between the metallized layer 2 and the heat sink member 6 serving as a radiating member.

Figure 3:
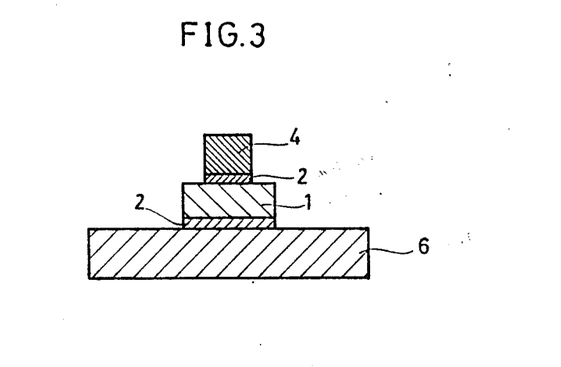
FIG. 3 is a sectional view showing an embodiment of a member for a semiconductor apparatus in accordance with the present invention, which is applied to a heat sink member for a semiconductor device such as a light emitting diode (LED) or a laser diode (LD)

Description is now made on another embodiment of a member for a semiconductor apparatus in accordance with another aspect of the present invention, which is applied to a radiating substrate for carrying a semiconductor device such as a diode having high calorific power, for example, with reference to FIG. 3. Referring to FIG. 3, an aluminum nitride substrate 1 is mounted on a heat sink member 6, serving as a radiating member mainly formed of the copper-tungsten alloy or the copper-molybdenum alloy in accordance with the present invention, through a metallized layer 2 similarly to the above, while a semiconductor device 4 such as a light emitting diode (LED) or a laser diode (LD) is joined on the aluminum nitride substrate 1. The semiconductor device 4 is joined on another metallized layer 2 which is formed on the surface of the aluminum nitride substrate 1. In this case, the aluminum nitride substrate 1 serves as a heat sink member. The aluminum nitride substrate 1 and the heat sink member 6 are joined with each other in a similar manner to the above description with reference to the junction structure between the aluminum nitride substrate provided with the lead frame and the heat sink member.

Figure 4:
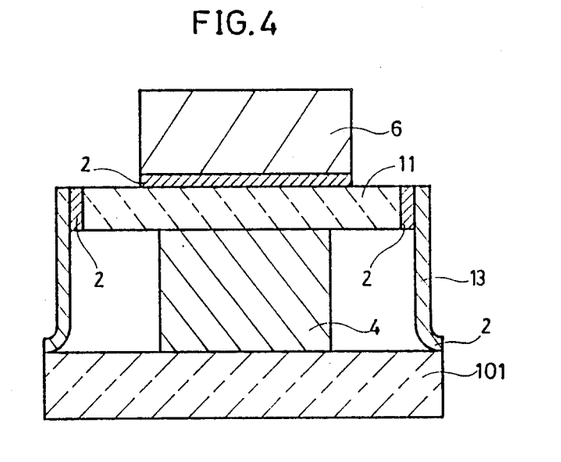
FIG. 4 is a sectional view showing another embodiment of the inventive member for a semiconductor apparatus, which is applied to a part of a cap for airtightly sealing a semiconductor device to serve as a covering member.

Description is now made on the structure of a cap to which a member for a semiconductor apparatus in accordance with the present invention is applied, with reference to FIG. 4. A metallized layer 2 is provided on the surface of a peripheral edge portion of a covering member 11 formed by an aluminum sintered body. A frame member 13 formed by a layer of a metal such as an iron-nickel alloy is joined to the metallized layer 2 by a soldering metal or the like. The lower end of the frame member 13 is joined to a ceramic substrate 101 through another metallized layer 2. A semiconductor device 4 is carried on the ceramic substrate 101. A heat sink member 6 is mounted on the upper surface of the covering member 11, so that heat generated from the semiconductor device 4 is dissipated by the heat sink member 6 through the covering member 11, to improve a cooling effect. The covering member 11 of the aluminum nitride sintered body and the heat sink member 6 are joined with each other in a similar manner to the above description with reference to the junction structure between the aluminum nitride substrate provided with the lead frame and the heat sink member. The soldering metal employed for such junction is preferably prepared by silver solder, while another soldering material is also available so far as a thin metal coating layer having a good wettability relative to the soldering material, can be formed on the junction surface of the heat sink member 6 or the metallized layer 2 to strongly join the covering member 11 and the heat sink member 6 with each other. The function of such a thin metal coating layer, such as a plating layer, is as hereinabove described with reference to the example of junction structure between the aluminum nitride substrate provided with the lead frame and the heat sink member.

Description is now made on Examples 1 and 2 of the present invention, which were made by samples prepared by substrates of the aluminum nitride sintered body obtained by the aforementioned method.

EXAMPLE 1

Aluminum nitride sintered substrates of 1.3 mm in thickness were prepared by the aforementioned method, to be subjected to metallization. The metallization processing was performed by applying a metal paste of a prescribed composition to the surfaces of respective samples of the aluminum nitride sintered substrates, performing debindering and then firing the same in a nitrogen atmosphere at a temperature of 1600° C. for 60 minutes. Thus, metallized layers were formed on prescribed portions of the aluminum nitride sintered substrates. The metal paste was prepared by adding calcium oxide powder and alumina powder to tungsten powder and kneading the same with an organic binder. The content of calcium oxide was 14 percent by weight and that of alumina was 4 percent by weight. The shapes of the employed aluminum nitride sintered substrates were 5 mm square, 20 mm square and 50 mm square respectively.

Further, nickel plating layers of 2 μm in thickness were formed on the surfaces of the metallized layers. On the other hand, copper-tungsten alloy plates of 1.5 mm in thickness having various compositions were prepared as radiating members to be joined to the respective aluminum nitride sintered substrates. Nickel plating of 2 μm in thickness was performed on the surfaces of these copper-tungsten alloy plates, which were then soldered to the respective aluminum nitride sintered substrates by silver solder with interposition of stress relieving members of nickel or copper at a temperature of 830° C.

Figure 5:
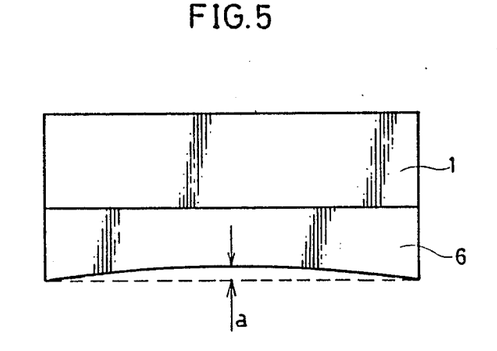
FIG. 5 is a side elevational view showing a portion subjected to measurement of a warp caused in a radiating member joined to an aluminum nitride substrate.

Examination was made as to whether or not the aluminum nitride sintered substrates were cracked and whether or not the copper-tungsten alloy plates were warped in the respective samples thus obtained. As shown in FIG. 5, an aluminum nitride sintered substrate 1 and a heat sink member 6 of each sample were joined with each other, to evaluate the degree of warping as the amount a by a surface roughness tester (product of Tokyo Seimitsu: E-SP-S01A). Cracks caused in the respective aluminum nitride sintered substrates were observed by a scanning type electron microscope of 5000 magnifications or a steromicroscope of 40 magnifications. Tables 1 to 3 show the results. As to evaluation of warps, those of not more than 2 μm with respect to effective length of 1 mm were regarded as "no warp", while samples causing warps exceeding 2 μm with respect to effective length of 1 mm were regarded as "warped".

The numerals 5, 10 and 20 in "CuW5", "CuW10" and "CuW20" in Tables indicate contents of copper in the copper-tungsten alloys. As to the copper-tungsten alloys, thermal expansion coefficients of CuW5, CuW10 and CuW20 were 6.0 to $7.0 \times 10^{-6}$/K, 6.5 to $7.5 \times 10^{-6}$/K and 8.5 to $9.5 \times 10^{-6}$/K in a range of the room temperature to 950° C. Further, values of thermal conductivity of CuW5, CuW10 and CuW20 were 180 W/mK, 210 W/mK and 246 W/mK respectively.

The wording "cracked" in Tables indicates that cracks were caused in the interiors of the aluminum nitride sintered substrates.

Similar evaluation was also made on reference examples including no interposed layers serving as stress relieving members. Table 4 shows the results.

According to Table 1, neither a crack nor a warp was recognized in samples having interposed layers, serving as the stress relieving members in accordance with the present invention, of at least 100 μm in thickness. According to Table 2, neither a warp nor a crack was recognized in samples having interposed layers of 500 μm in thickness. According to Table 3, no crack nor warp was recognized in samples having interposed layers of 1000 μm in thickness, while those having interposed layers of less than and in excess of 1000 μm in thickness presented cracks and/or warps. As shown in Table 4, all samples of reference examples, including no interposed layers for serving as stress relieving members, presented warps and/or cracks.

TABLE 1

(□ 5 mm)

| Thickness of Interposed Layer | Interposed Layer of Ni | | | Cu | | | Cu Layer with Ni Plating of 4 μm | | |
|---|---|---|---|---|---|---|---|---|---|
| | CuW5 | CuW10 | CuW20 | CuW5 | CuW10 | CuW20 | CuW5 | CuW10 | CuW20 |
| 10 μm | warped | warped | warped | no warp | warped | warped | no warp | no warp | warped |
| 100 μm | no warp | no warp | no warp | no warp | no warp | no warp | no warp | no warp | no warp |
| 500 μm | no warp | no warp | no warp | no warp | no warp | no warp | no warp | no warp | no warp |

TABLE 2

(□ 20 mm)

| Thickness of Interposed Layer | Interposed Layer of Ni | | | Cu | | | Cu Layer with Ni Plating of 4 μm | | |
|---|---|---|---|---|---|---|---|---|---|
| | CuW5 | CuW10 | CuW20 | CuW5 | CuW10 | CuW20 | CuW5 | CuW10 | CuW20 |
| 10 μm | warped | warped (cracked) | warped (cracked) | warped | warped | warped (cracked) | warped | warped | warped (cracked) |
| 100 μm | no warp | warped | warped | no warp | warped | warped | no warp | no warp | warped |
| 500 μm | no warp | no warp | no warp | no warp | no warp | no warp | no warp | no warp | no warp |

TABLE 3

(□ 50 mm)

| Thickness of Interposed Layer | Interposed Layer of Ni | | | Cu | | | Cu Layer with Ni Plating of 4 μm | | |
|---|---|---|---|---|---|---|---|---|---|
| | CuW5 | CuW10 | CuW20 | CuW5 | CuW10 | CuW20 | CuW5 | CuW10 | CuW20 |
| 100 μm | warped (cracked) | warped (cracked) | warped (cracked) | warped (cracked) | warped (cracked) | warped (cracked) | warped (cracked) | warped (cracked) | warped (cracked) |
| 500 μm | warped | warped | warped (cracked) | no warp | warped | warped | no warp | no warp | warped |
| 1000 μm | no warp | no warp | no warp | no warp | no warp | no warp | no warp | no warp | no warp |
| 1500 μm | no warp (cracked) | no warp (cracked) | no warp (cracked) | no warp (cracked) | no warp (cracked) | no warp (cracked) | no warp (cracked) | no warp (cracked) | no warp (cracked) |

TABLE 4

(Reference Example)

| | CuW5 | CuW10 | CuW20 |
|---|---|---|---|
| □ 5 mm | warped | warped (cracked) | warped (cracked) |
| □ 20 mm | warped (cracked) | warped (cracked) | warped (cracked) |
| □ 50 mm | warped (cracked) | warped (cracked) | warped (cracked) |

EXAMPLE 2

Samples of aluminum nitride sintered substrates with metallized layers were prepared by the aforementioned method as shown in FIG. 1B. The metallization processing of samples was performed by applying tungsten paste of prescribed composition to the surfaces of respective samples of the aluminum formed substrates shaped in a configuration such as a green sheet by the aforementioned method with screen printing of prescribed patterns, drying, performing debindering and then sintering the same in a nitrogen-hydrogen atmosphere at a temperature of 1850° C. for 5 minutes. Thus, metallized layers were formed on prescribed portions of aluminum nitride sintered substrates. The shapes of the employed aluminum nitride sintered substrates with metallized layers were 5 mm square, 20 mm square and 50 mm square of 1.5 mm in thickness respectively.

Further, nickel plating layers were formed on the surfaces of the metallized layers, similarly to Example 1. On the other hand, copper-molybdenum alloy plates of 1.5 mm in thickness having various compositions were prepared as radiating members to be joined to the respective aluminum nitride sintered substrates. Nickel plating of 2 μm in thickness was performed on the surfaces of these copper-molybdenum alloy plates, which were then soldered to the respective aluminum nitride sintered substrates by silver solder with interposition of stress relieving members of nickel or copper in a hydrogen atmosphere at a temperature of 830° C.

Examination was made as to cracks of the aluminum nitride sintered substrates and warps of the copper-molybdenum alloy plates similarly to Example 1. Tables 5 to 7 show the results.

The numerals 10, 15 and 20 in "CuMo10", "CuMo15" and "CuMo20" in Tables indicate contents of copper in the copper-molybdenum alloys. As to the copper-molybdenum alloys, thermal expansion coefficients of CuMo10, CuMo15 and CuMo20 were 6.4 to $6.8 \times 10^{-6}$/K, 7.0 to $7.4 \times 10^{-6}$/K and 7.6 to $8.3 \times 10^{-6}$/K in a range of the room temperature to 950° C. Further, values of thermal conductivity of CuMo10, CuMo15 and CuMo20 were 165 W/mK, 184 W/mK and 196 W/mK respectively.

Similar evaluation was also made on reference examples including no interposed layers serving as stress relieving members. Table 8 shows the results.

According to Table 5, neither a crack nor a warp was recognized in samples having an interposed layer, serving as the stress relieving members in accordance with the present invention, of at least 100 μm in thickness. According to Table 6, neither a warp nor a crack was recognized in samples having interposed layers of 500 μm in thickness. According to Table 7, neither a crack nor a warp was recognized in samples having interposed layers of 1000 μm in thickness, while those having interposed layers of less than and in excess of 1000 μm in thickness presented cracks and/or warps. As shown in Table 8, all samples of reference examples, including no interposed layers for serving as stress relieving members, presented warps and/or cracks.

TABLE 5

(□ 5 mm)

| Thickness of Interposed Layer | Interposed Layer of Ni | | | Cu | | | Cu Layer with Ni Plating of 4 μm | | |
|---|---|---|---|---|---|---|---|---|---|
| | CuMo10 | CuMo15 | CuMo20 | CuMo10 | CuMo15 | CuMo20 | CuMo10 | CuMo15 | CuMo20 |
| 10 μm | warped | warped | warped | warped | warped | warped | no warp | no warp | no warp |
| 100 μm | no warp | no warp | no warp | no warp | no warp | no warp | no warp | no warp | no warp |
| 500 μm | no warp | no warp | no warp | no warp | no warp | no warp | no warp | no warp | no warp |

TABLE 6

(□ 20 mm)

| Thickness of Interposed Layer | Interposed Layer of Ni | | | Cu | | | Cu Layer with Ni Plating of 4 μm | | |
|---|---|---|---|---|---|---|---|---|---|
| | CuMo10 | CuMo15 | CuMo20 | CuMo10 | CuMo15 | CuMo20 | CuMo10 | CuMo15 | CuMo20 |
| 10 μm | warped (cracked) | warped (cracked) | warped (cracked) | warped | warped (cracked) | warped (cracked) | warped | warped (cracked) | warped (cracked) |
| 100 μm | warped | warped | warped | warped | warped | warped | warped | warped | warped |
| 500 μm | no warp | no warp | no warp | no warp | no warp | no warp | no warp | no warp | no warp |

TABLE 7

(□ 50 mm)

| Thickness of Interposed Layer | Interposed Layer of Ni | | | Cu | | | Cu Layer with Ni Plating of 4 μm | | |
|---|---|---|---|---|---|---|---|---|---|
| | CuMo10 | CuMo15 | CuMo20 | CuMo10 | CuMo15 | CuMo20 | CuMo10 | CuMo15 | CuMo20 |
| 100 μm | warped (cracked) | warped (cracked) | warped (cracked) | warped (cracked) | warped (cracked) | warped (cracked) | warped (cracked) | warped (cracked) | warped (cracked) |
| 500 μm | warped | warped (cracked) | warped (cracked) | no warp | warped | warped | no warp | no warp | warped |
| 1000 μm | no warp | no warp | no warp | no warp | no warp | no warp | no warp | no warp | no warp |
| 1500 μm | no warp (cracked) | no warp (cracked) | no warp (cracked) | no warp (cracked) | no warp (cracked) | no warp (cracked) | no warp (cracked) | no warp (cracked) | no warp (cracked) |

TABLE 8

(Reference Example)

| | CuMo10 | CuMoW15 | CuMo20 |
|---|---|---|---|
| □ 5 mm | warped (cracked) | warped (cracked) | warped (cracked) |
| □ 20 mm | warped (cracked) | warped (cracked) | warped (cracked) |
| □ 50 mm | warped (cracked) | warped (cracked) | warped (cracked) |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A member for a semiconductor apparatus for carrying or holding a semiconductor device, said member comprising:
   an insulating member of aluminum nitride having a major surface to face said semiconductor device;
   a radiating member to be joined to said insulating member, being mainly formed of a material selected from a group of a copper-tungsten alloy and a copper-molybdenum alloy;
   a stress relieving member interposed between said insulating member and said radiating member; and
   a soldering member for joining said insulating member, said stress relieving member and said radiating member with each other,
   said stress relieving member being prepared by any soft metal and a soft alloy having a high plastic deformability in order to relax, by its own plastic deformation, thermal stress caused by difference in thermal expansion coefficient between said insulating member and said radiating member in a cooling step upon soldering.

2. A member for semiconductor apparatus in accordance with claim 1, wherein
   said stress relieving member is formed of a material selected from a group of copper, a copper alloy, nickel and a nickel alloy.

3. A member for a semiconductor apparatus in accordance with claim 1, wherein
   said insulating member includes a substrate having a major surface to be provided thereon with said semiconductor device.

4. A member for a semiconductor apparatus in accordance with claim 1, wherein
   said insulating member includes a covering member provided above said semiconductor device to protect the same.

5. A member for a semiconductor apparatus in accordance with claim 1, wherein
   said insulating member includes a sintered body.

6. A member for a semiconductor apparatus in accordance with claim 1, further comprising a metallized layer formed in a junction surface of said insulating member.

7. A member for a semiconductor apparatus in accordance with claim 6, wherein
   said metallized layer contains at least one metal within tungsten and molybdenum, at least one aluminum compound selecting from a group of aluminum nitride, aluminum oxide and aluminum oxynitride, and calcium oxide.

8. A number for a semiconductor apparatus in accordance with claim 6, further comprising a plating layer formed in a junction surface between said metallized layer and said soldering member.

9. A member for a semiconductor device in accordance with claim 8, further comprising a plating layer formed in a junction surface between said radiating member and said soldering member.

* * * * *